United States Patent
Chen et al.

(10) Patent No.: US 9,941,140 B2
(45) Date of Patent: Apr. 10, 2018

(54) SEMICONDUCTOR DEVICES AND METHODS OF MANUFACTURE THEREOF

(71) Applicant: Taiwan Semiconductor Manufacturing Co., Ltd., Hsin-Chu (TW)

(72) Inventors: Yu-Feng Chen, Hsin-Chu (TW); Kai-Chiang Wu, Hsin-Chu (TW); Chun-Lin Lu, Hsin-Chu (TW); Hung-Jui Kou, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/437,193

(22) Filed: Feb. 20, 2017

(65) Prior Publication Data

US 2017/0162541 A1 Jun. 8, 2017

Related U.S. Application Data

(60) Continuation of application No. 14/961,663, filed on Dec. 7, 2015, now Pat. No. 9,576,874, which is a
(Continued)

(51) Int. Cl.
*H01L 21/3205* (2006.01)
*H01L 23/00* (2006.01)
(Continued)

(52) U.S. Cl.
CPC ........ *H01L 21/3205* (2013.01); *H01L 21/283* (2013.01); *H01L 21/3213* (2013.01); *H01L 21/34* (2013.01); *H01L 21/78* (2013.01); *H01L 23/4334* (2013.01); *H01L 23/544* (2013.01); *H01L 24/03* (2013.01); *H01L 24/05* (2013.01); *H01L 24/11* (2013.01); *H01L 24/13* (2013.01); *H01L 24/94* (2013.01); *H01L 2223/5446* (2013.01); *H01L 2224/0226* (2013.01); *H01L 2224/02235* (2013.01);
(Continued)

(58) Field of Classification Search
CPC ......... H01L 23/16; H01L 23/24; H01L 23/28; H01L 23/31; H01L 23/3142; H01L 23/3157; H01L 23/3171; H01L 23/3736; H01L 23/4334; H01L 2224/83051; H01L 21/28; H01L 21/283; H01L 21/3205; H01L 21/3213
See application file for complete search history.

(56) References Cited

U.S. PATENT DOCUMENTS 6,593,220 B1  7/2003  Yu et al.
6,919,642 B2  7/2005  Hsieh et al.
(Continued)

FOREIGN PATENT DOCUMENTS

CN  1209795 C    7/2005
CN  102810528 A  12/2012

*Primary Examiner* — Eduardo A Rodela
(74) *Attorney, Agent, or Firm* — Slater Matsil, LLP

(57) ABSTRACT

Semiconductor devices and methods of manufacture thereof are disclosed. In some embodiments, a semiconductor device includes a substrate, and a plurality of contact pads disposed over the substrate. The contact pads may be arranged in a ball grid array (BGA), and the may include a plurality of corners. A metal dam is disposed around each of the plurality of corners, such as corners of the BGA.

20 Claims, 6 Drawing Sheets

Related U.S. Application Data division of application No. 14/015,808, filed on Aug. 30, 2013, now Pat. No. 9,209,140.

(51) Int. Cl.
*H01L 23/544* (2006.01)
*H01L 21/78* (2006.01)
*H01L 21/3213* (2006.01)
*H01L 23/433* (2006.01)
*H01L 21/283* (2006.01)
*H01L 21/34* (2006.01)

(52) U.S. Cl.
CPC ............ *H01L 2224/02255* (2013.01); *H01L 2224/03462* (2013.01); *H01L 2224/03464* (2013.01); *H01L 2224/0401* (2013.01); *H01L 2224/05111* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/11318* (2013.01); *H01L 2224/13026* (2013.01); *H01L 2224/13109* (2013.01); *H01L 2224/13111* (2013.01); *H01L 2224/13116* (2013.01); *H01L 2224/13139* (2013.01); *H01L 2224/13147* (2013.01); *H01L 2924/014* (2013.01); *H01L 2924/01029* (2013.01)

(56) References Cited

U.S. PATENT DOCUMENTS

| | | |
|---|---|---|
| 7,279,795 B2 | 10/2007 | Periaman et al. |
| 7,432,602 B2 | 10/2008 | Kuramochi |
| 8,643,148 B2 | 2/2014 | Lin et al. |
| 8,692,357 B2 | 4/2014 | Ning |
| 8,692,657 B2 | 4/2014 | Ning |
| 8,829,667 B2 | 9/2014 | Park et al. |
| 9,128,123 B2 | 9/2015 | Liu et al. |
| 2001/0038144 A1 | 11/2001 | Grigg |
| 2005/0051886 A1 | 3/2005 | Mihara et al. |
| 2005/0205984 A1 | 9/2005 | Chen-Tung et al. |
| 2008/0012132 A1 | 1/2008 | Lin |
| 2008/0135959 A1 | 6/2008 | Theuss et al. |
| 2008/0155820 A1 | 7/2008 | Arai et al. |
| 2009/0243090 A1 | 10/2009 | Kim et al. |
| 2009/0294938 A1 | 12/2009 | Chen |
| 2010/0013032 A1 | 1/2010 | Oppermann et al. |
| 2010/0127377 A1 | 5/2010 | Bauer et al. |
| 2011/0031591 A1 | 2/2011 | Min et al. |
| 2011/0084375 A1 | 4/2011 | Eu et al. |
| 2011/0210436 A1 | 9/2011 | Chow et al. |
| 2011/0279717 A1* | 11/2011 | Wakiyama ............ H01L 21/563 348/294 |
| 2011/0304049 A1* | 12/2011 | Shigihara .......... H01L 23/53238 257/762 |
| 2011/0304999 A1 | 12/2011 | Yu et al. |
| 2012/0008580 A1 | 1/2012 | Lee et al. |
| 2012/0068353 A1* | 3/2012 | Huang .................. H01L 21/561 257/774 |
| 2012/0098123 A1 | 4/2012 | Yu et al. |
| 2012/0126395 A1 | 5/2012 | Lee et al. |
| 2012/0305916 A1 | 12/2012 | Liu et al. |
| 2013/0075937 A1 | 3/2013 | Wang et al. |
| 2013/0341773 A1 | 12/2013 | Bauer et al. |
| 2014/0036466 A1 | 2/2014 | Pahl et al. |
| 2014/0252608 A1* | 9/2014 | Chen .................. H01L 21/4846 257/738 |
| 2014/0353838 A1 | 12/2014 | Lin et al. |
| 2014/0367854 A1 | 12/2014 | Zhao et al. |
| 2015/0008580 A1 | 1/2015 | Joh |
| 2015/0014844 A1 | 1/2015 | Nu et al. |
| 2015/0014863 A1* | 1/2015 | Shih ........................ H01L 24/94 257/777 |
| 2015/0061127 A1 | 3/2015 | Chen et al. |

* cited by examiner

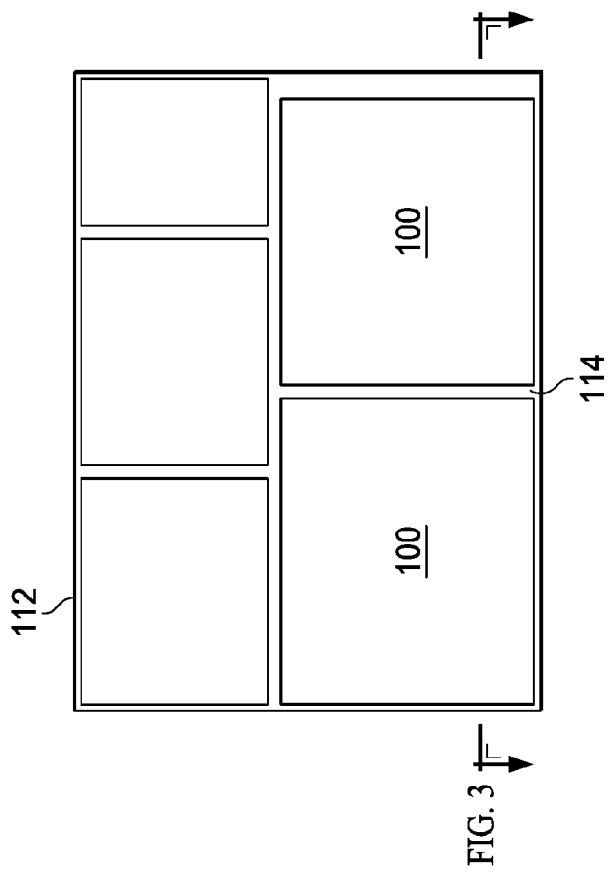
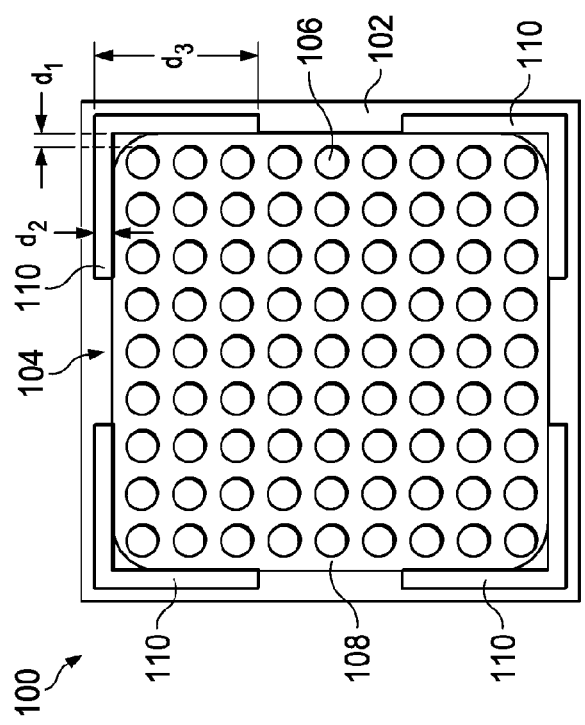
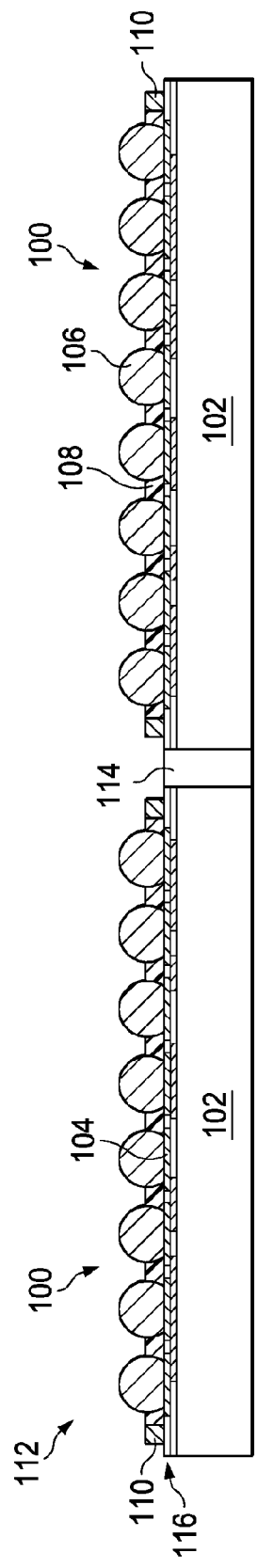

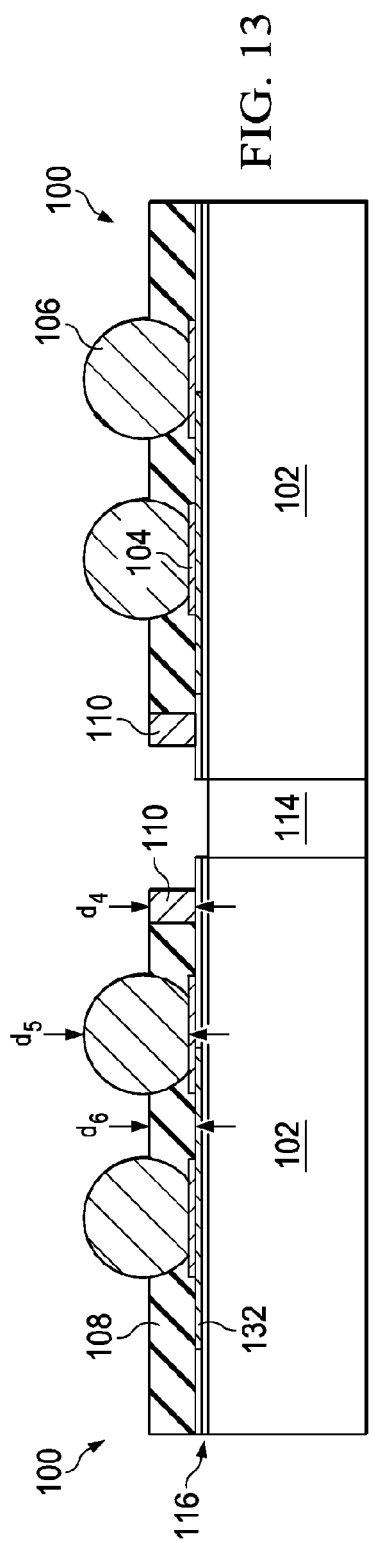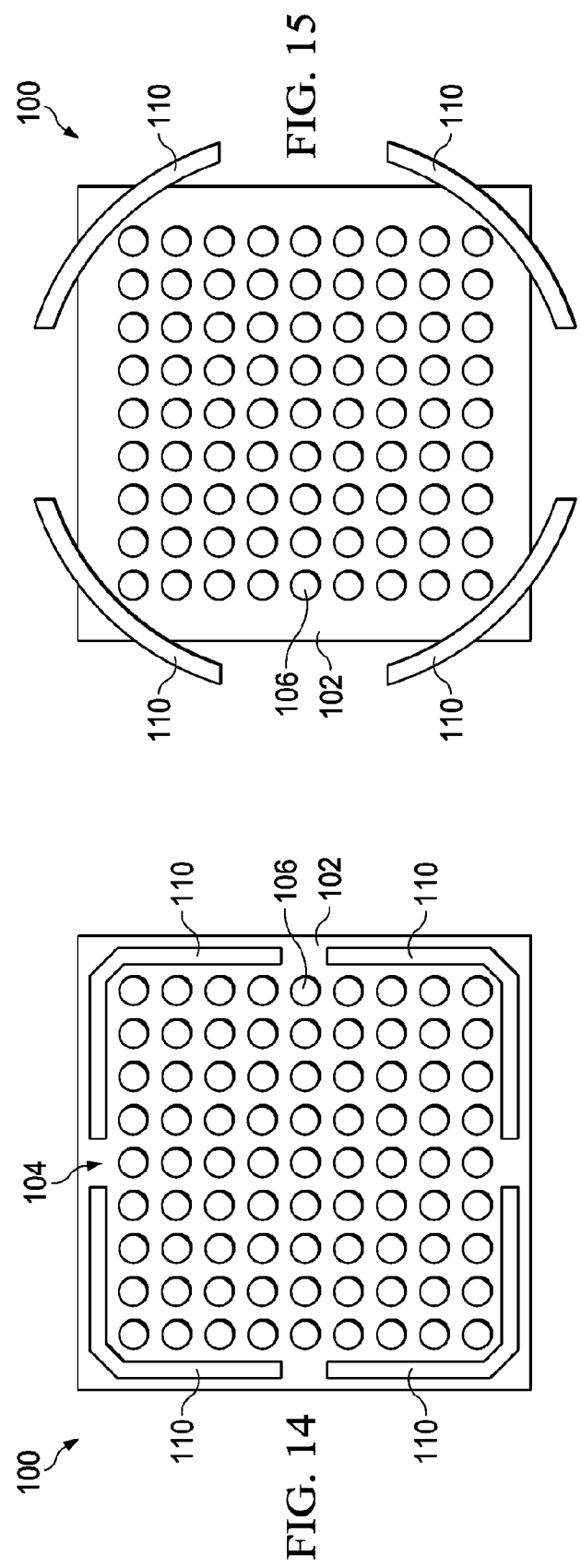

SEMICONDUCTOR DEVICES AND METHODS OF MANUFACTURE THEREOF

This application is a continuation application of U.S. patent application Ser. No. 14/961,663, filed on Dec. 7, 2015, entitled "Semiconductor Devices and Methods of Manufacture Thereof," which is a divisional application of U.S. patent application Ser. No. 14/015,808, now U.S. Pat. No. 9,209,140, filed on Aug. 30, 2013, entitled "Semiconductor Devices and Methods of Manufacture Thereof," which applications are hereby incorporated herein by reference in their entirety.

CROSS-REFERENCE TO RELATED APPLICATIONS

This application relates to the following co-pending and commonly assigned patent application: Ser. No. 13/938,821, filed on Jul. 10, 2013, entitled, "Die-on-Interposer Assembly with Dam Structure and Method of Manufacturing the Same," which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies also require smaller packages that utilize less area than packages of the past, in some applications.

One type of smaller packages for semiconductor devices that has been developed is wafer level packages (WLPs), in which integrated circuits are packaged in packages that typically include a redistribution layer (RDL) or post passivation interconnect (PPI) that is used to fan-out wiring for contact pads of the package so that electrical contacts can be made on a larger pitch than contact pads of the integrated circuit. WLPs are often used to package integrated circuits (ICs) demanding high speed, high density, and greater pin count, as examples.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 1 shows a bottom view of a semiconductor device that includes a metal dam proximate corner regions in accordance with some embodiments of the present disclosure;

FIG. 2 is a bottom view illustrating a semiconductor wafer including a plurality of the semiconductor devices shown in FIG. 1 in accordance with some embodiments;

FIG. 3 is a cross-sectional view of a portion of the semiconductor wafer shown in FIG. 2;

FIG. 13 is a cross-sectional view of semiconductor devices in accordance with some embodiments;

FIGS. 14 and 15 are bottom views illustrating various shapes of metal dams of semiconductor devices in accordance with some embodiments.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 4:
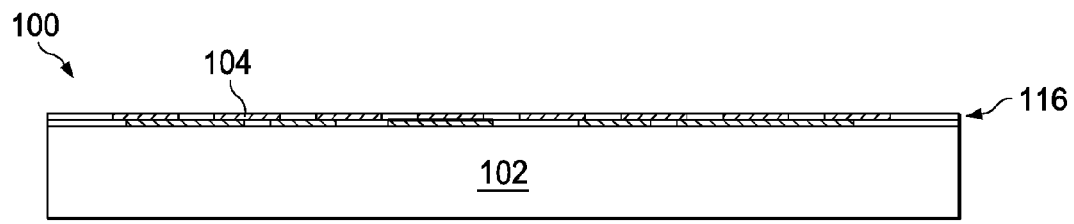
FIGS. 4 through 7 illustrate cross-sectional views of a method of manufacturing a semiconductor device including a metal dam at various stages in accordance with some embodiments.

The making and using of some of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Some embodiments of the present disclosure are related to methods of manufacturing semiconductor devices and structures thereof. Novel semiconductor devices that have a ball grid array (BGA) with a metal dam structure proximate corner regions will be described herein. The novel structures and manufacturing methods can be implemented on integrated circuit dies, interposer packages, or other types of packaging devices.

Referring first to FIG. 1, there is shown a bottom view of a semiconductor device 100 in accordance with some embodiments of the present disclosure. The semiconductor device 100 includes a substrate 102. The substrate 102 may include a semiconductor substrate comprising silicon or other semiconductor materials and may be covered by an insulating layer, for example. The substrate 102 may include active components or circuits, not shown. In some embodiments, the substrate 102 does not include active components or circuits. The substrate 102 may comprise silicon oxide over single-crystal silicon, for example. The substrate 102 may include other conductive layers or other semiconductor elements, e.g., transistors, diodes, resistor, inductors, capacitors, etc. Compound semiconductors, GaAs, InP, Si/Ge, or SiC, as examples, may be used in place of silicon. The substrate 102 may comprise a silicon-on-insulator (SOI) or a germanium-on-insulator (GOI) substrate, as examples. In some embodiments, the substrate 102 comprises an integrated circuit die that includes circuitry formed thereon, not shown. In some embodiments, the substrate 102 comprises an interposer substrate, such as an interposer substrate for a WLP, as another example.

The substrate 102 includes a plurality of contact pads 104 formed thereon. The contact pads 104 are not visible in FIG. 1; see FIG. 3. The contact pads 104 are arranged in a ball grid array (BGA) arrangement in rows in columns. A fully populated BGA is shown; alternatively, the BGA may comprise groups of contact pads 104 in predetermined areas, with no contact pads being formed in other areas.

A conductive material 106 comprising conductive bumps or solder balls is coupled to the contact pads 104. The conductive material 106 comprises a eutectic material such as solder, in some embodiments. The use of the word "solder" herein includes both lead-based and lead-free solders, such as Pb—Sn compositions for lead-based solder; lead-free solders including InSb; tin, silver, and copper ("SAC") compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free conductive materials such as solder balls may be formed from SnCu compounds as well, without the use of silver (Ag). Alternatively, lead-free solder connectors may include tin and silver, Sn—Ag, without the use of copper.

The conductive material 106 may comprise microbumps, controlled collapse chip connection (C4) bumps, or other types of connectors. The conductive material 106 may comprise spherical or non-spherical connectors, for example. The conductive material 106 comprises a substantially spherical shape with one flat side proximate the contact pads 104, in some embodiments. The conductive material 106 is attached to the contact pads 104 using a 'solder ball drop' process or other method.

A protective material 108 is disposed over the substrate 102 between the conductive material 106 over each of the contact pads 104. The protective material 108 comprises a resin that is spin-coated onto the substrate 102 in some embodiments. The protective material 108 comprises an encapsulation resin in some embodiments, for example. The protective material 108 comprises a protective film that is coated over the substrate 102 between the conductive material 106. The protective material 108 comprises an insulating material and comprises a resin, polyimide, epoxy, polybenzoxazole (PBO), other type of resins, and/or combinations thereof, as examples. Alternatively, the protective material 108 may comprise other materials.

The protective material 108 comprises a material having a transmittance of about 70% or greater in some embodiments. Alternatively, the transmittance of the protective material 108 may comprise other values. The protective material 108 may comprise an ultra-low temperature cure type polyimide structure manufactured by Asahi Kasei E-materials Corporation, as an example, which has a transmittance of about 80%. The protective material 108 may comprise PBO, as another example, which has a transmittance of about 82%. Alternatively, other materials may be used for the protective material 108. In some embodiments, the protective material 108 comprises a material that will have a thickness of greater than about 10 µm when spin-coated onto a blank wafer, for example.

The protective material 108 does not comprise a molding compound in some embodiments. The protective material 108 avoids the requirement of applying a molding compound between the substrate 102 and an object the conductive material 106 is later attached to, such as a packaging substrate, printed wiring board (PWB), mother board, system board, or other target system.

A metal dam 110 is disposed around each corner of the BGA of contact pads 104. The metal dam 110 comprises a conductive material such as copper or a copper alloy in some embodiments. The metal dam 110 comprises the same material as the contact pads 104 in some embodiments. The protective material 108 is also disposed between the metal dam 110 and the conductive material 106. The metal dam 110 ensures that the corners of the BGA are coated with the protective material 108, e.g., that all of the sides of the conductive material 106 in the corners of the BGA are coated with the protective material 108. The metal dam 110 improves the uniformity of the thickness of the protective material 108 in some embodiments, for example.

In the embodiment shown in FIG. 1, the metal dam 110 comprises a substantially square shape in a bottom view. Alternatively, the metal dam 110 may comprise other shapes. The metal dam 110 may comprise substantially a shape of a square, rectangle, polygon, circle, or oval, in a bottom view of the substrate 102 in some embodiments, as examples. Alternatively, the metal dam 110 may comprise other shapes.

The metal dam 110 is discontinuous in a bottom view of the substrate 102. For example, in FIG. 1, the metal dam 110 is formed only around the corners of the BGA of contact pads 104, and not around central regions of the sides of the BGA. The metal dam 110 is only formed in regions of the BGA that need improvement of the thickness of the protective material 108, for example, in some embodiments.

The metal dam 110 is spaced apart from each of the plurality of contact pads 104 by a dimension $d_1$ which comprises about 100 µm or greater, in some embodiments. The metal dam 110 comprises a width in the bottom view of the semiconductor device 100 comprising dimension $d_2$ of about 25 µm or greater in some embodiments. The sides of the metal dam 110 extend along sides of the BGA of contact pads 104 by a length comprising dimension $d_3$, which comprises about ⅓ of a length or width of an integrated circuit die or greater in some embodiments, for example. Alternatively, dimensions $d_1$, $d_2$, and $d_3$ may comprise other values.

FIG. 2 is a bottom view illustrating a semiconductor wafer 112 including a plurality of the semiconductor devices 100 shown in FIG. 1 in accordance with some embodiments. Several semiconductor devices 100 are manufactured on a semiconductor wafer 112, and the semiconductor devices 100 are singulated along scribe lines 114 to form individual semiconductor devices 100 that can then be packaged separately or with other devices 100, used in an end application, or that can be used as packaging devices, in embodiments wherein the substrate 102 comprises an interposer substrate, for example.

FIG. 3 is a cross-sectional view of a portion of the semiconductor wafer 112 shown in FIG. 2. The semiconductor devices 100 include a redistribution layer (RDL) 116 in some embodiments. The contact pads 104 are part of the RDL 116 in some embodiments. Alternatively, the contact pads 104 may be coupled to the RDL 116 or to other types of wiring of the semiconductor device 100. The RDL 116 includes conductive wiring and insulating material layers, and may include an underball metallization (UBM) structure and/or post-passivation interconnect (PPI) in some embodiments, as examples. In embodiments where the RDL 116 comprises a PPI, the wiring of the PPI may include PPI lines and contact pads 104 comprising PPI pads 104 disposed over the substrate 102, as another example.

FIGS. 4 through 7 illustrate cross-sectional views of a method of manufacturing a semiconductor device 100 including a metal dam 110 at various stages in accordance with some embodiments. First, the substrate 102 is provided. The semiconductor device 100 is typically square or rectangular and has four corners (see FIG. 1); however, in some applications a semiconductor device 100 can have other shapes and numbers of corners, for example. The substrate 102 may include one or more integrated circuits (ICs) formed thereon, not shown. The IC(s) may contain active and passive devices, conductive layers, and dielectric layers according to the electrical design of the IC(s), as examples.

The method includes forming a plurality of contact pads 104 over the substrate 102, as shown in FIG. 4. The plurality of contact pads 104 is arranged in a BGA that includes a plurality of corners. The contact pads 104 are formed proximate a top surface of the substrate 102 in an uppermost metallization or semiconductive layer in some embodiments.

The contact pads 104 are formed using a patterning and deposition process of a conductive material layer over the substrate 102. The contact pads 104 may comprise aluminum (Al), copper (Cu), tin (Sn), nickel (Ni), gold (Au), silver (Ag), other electrically conductive materials, or multiple layers or combinations thereof, as examples. The contact pads 104 may be formed using an electrolytic plating or electro-less plating process, for example. The size, shape, and location of the contact pads 104 are only for illustration purposes. A plurality of contact pads 104 may be of the same size or of different sizes.

Figure 5:
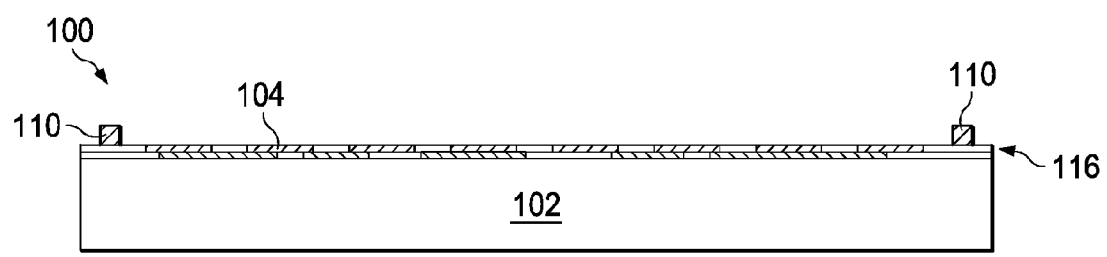

Next, a metal dam 110 is formed over the substrate 102 around each of the plurality of corners of the BGA, as shown in FIG. 5. In some embodiments, the metal dam 110 is plated onto the substrate 102. The metal dam 110 is formed over an insulating material of the RDL 116 in some embodiments, as shown in FIG. 5.

Figure 6:
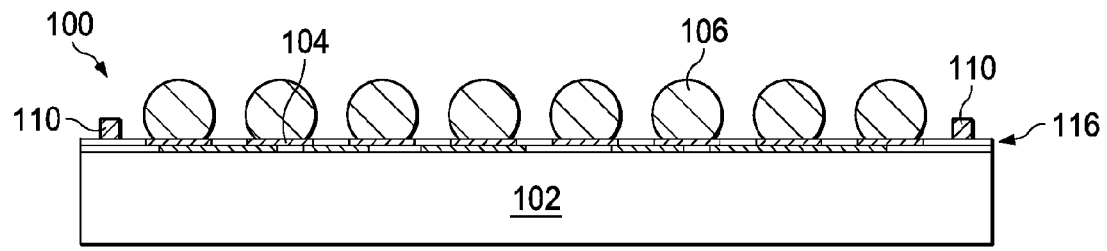

A conductive material 106 is formed over each of the plurality of contact pads 104, as shown in FIG. 6. The conductive material 106 is formed using a ball drop process in some embodiments, for example. Alternatively, other methods may be used to form the conductive material 106.

Figure 7:
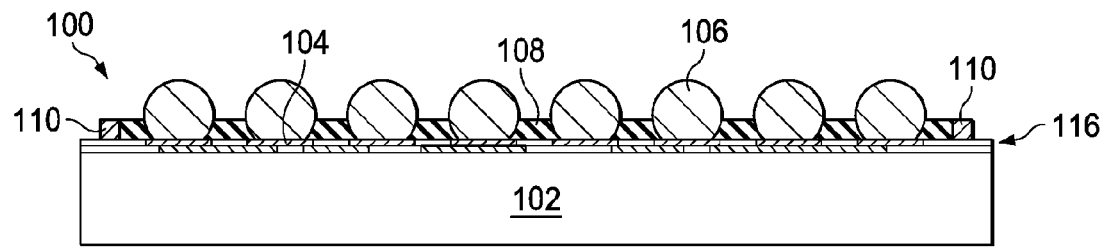
Figure 8:
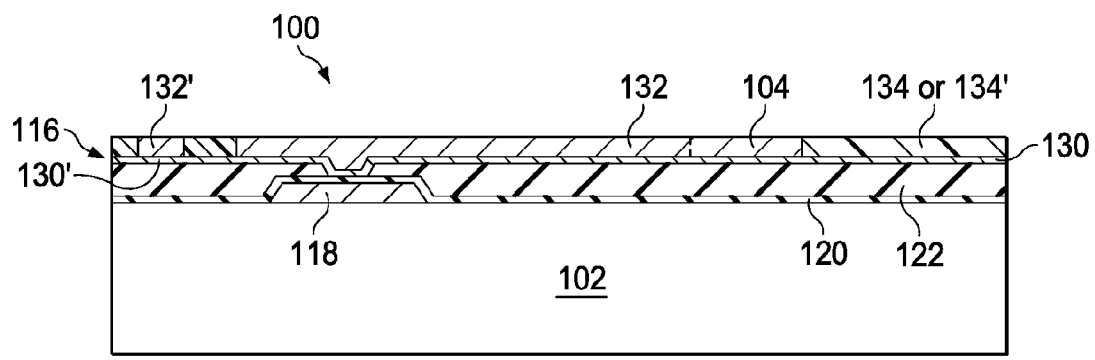
FIGS. 8 through 11 illustrate cross-sectional views of a method of manufacturing a metal dam of a semiconductor device at various stages in accordance with some embodiments.

A protective material 108 is formed over the substrate 102 between the conductive material 106 over each of the plurality of contact pads 104 and between the metal dam 110 and the conductive material 106, as shown in FIG. 7. The protective material 108 is spun-on in some embodiments. Alternatively, the protective material 108 may be formed using other methods. In some embodiments, the protective material 108 is cured using a heating process and/or an ultraviolet (UV) energy treatment process. In other embodiments, a curing step is not required.

FIGS. 8 through 11 illustrate cross-sectional views of a method of manufacturing a metal dam 110 of a semiconductor device 100 at various stages in accordance with some embodiments. An RDL 116 comprising a PPI is illustrated. The RDL 116 includes a plurality of contacts 118 disposed over the substrate 102. Only one contact 118 is shown in FIGS. 8 through 11; however, a plurality of contacts 118 is formed over the substrate 102 in accordance with some embodiments. The contacts 118 may comprise Al, Cu, Sn, Ni, Au, Ag, other electrically conductive materials, or multiple layers or combinations thereof, as examples.

A passivation layer 120 comprising an insulating material is formed over the contacts 118 and substrate 102 for structural support and physical isolation. The passivation layer 120 comprises silicon nitride (SiN), silicon dioxide ($SiO_2$), silicon oxynitride (SiON), polyimide (PI), benzocyclobutene (BCB), PBO, other insulating materials, or combinations or multiple layers thereof, as examples. An opening in the passivation layer 120 may be made by removing a portion of passivation layer 120 using a mask-defined photoresist etching process to expose a portion of the contacts 118, while leaving another portion of the contacts 118 covered.

An insulating material 122 is formed over the passivation layer 120. The insulating material 122 is formed on the passivation layer 120, following the contour of the passivation layer 120 and filling a portion of the opening of the passivation layer 120 over the contacts 118. The insulating material 122 may not completely fill the opening of the passivation layer 120 over the contact 118; rather, it may be patterned to form an opening to expose a portion of the contact 118, while covering other portions of the contact 118. Openings are formed in the insulating material 122 and passivation layer 120 using photolithography over the contacts 118 so that electrical connection can be made to the contacts 118. The insulating material 122 may be formed of a polymer, such as an epoxy, polyimide, benzocyclobutene (BCB), polybenzoxazole (PBO), and the like, although other relatively soft, often organic, dielectric materials may also be used. Spin coating or other commonly used formation methods may be used to apply the insulating material 122. In some embodiments, insulating material 122 comprises a "PBO" layer, for example. The thickness of the insulating material 122 may be between about 5 µm and about 30 µm, for example. Alternatively, the insulating material 122 may comprise other dimensions.

A seed layer 130 comprising a conductive material such as copper is formed over the contacts 118, the patterned insulating material 122, and the patterned passivation layer 120. In some embodiments, a layer of photoresist 134 is formed over the seed layer 130, and the layer of photoresist 134 is patterned simultaneously with a desired pattern for a post-passivation interconnect (PPI) comprising PPI lines 132, contact pads 104 that comprise PPI pads 104, and first portions 132' of the metal dam 110. The metal dam 110 also includes portions 130' of the seed layer 130. A plating process is then used to plate the PPI lines 132, PPI pads 104, and first portions 132' of the metal dam 110 over the seed layer 130, through the patterned layer of photoresist 134, simultaneously forming the metal dam 110 while forming the PPI lines 132 and PPI pads 104.

The PPI line 132, PPI pad 104, and first portions 132' of the metal dam 110 may have a thickness of less than about 30 µm, and may comprise a thickness of about 2 µm to about 10 µm in some embodiments, as examples. The PPI line 132, PPI pad 104, and first portions 132' of the metal dam 110 may comprise a metal such as Ti, Al, Ni, nickel vanadium (NiV), Cu, or combinations or multiple layers thereof, as examples. The PPI line 132, PPI pad 104, and first portions 132' of the metal dam 110 may be formed using electrolytic plating, electro-less plating, sputtering, chemical vapor deposition methods, and/or photolithography processes, for example. The PPI line 132, PPI pad 104, and first portions 132' of the metal dam 110 may comprise a single layer or multiple layers using an adhesion layer of Ti, TiW, Cr, or other materials, for example. Alternatively, the PPI lines 132, PPI pads 104, and first portions 132' of the metal dam 110 may comprise other materials and dimensions, and may be formed using other methods. The substrate 102 is connected to a number of PPI lines 132 and PPI pads 104 which may electrically connect to the contacts 118 of the substrate 102, for example.

In some embodiments, the PPI lines 132, PPI pads 104, and first portions 132' of the metal dam 110 are formed simultaneously using a subtractive etch process, by depositing a conductive material over the contacts 118 and patterned insulating material 122 and passivation layer 120, and patterning the conductive material using a photolithography process. An insulating material 134' is then formed over the PPI lines 132, PPI pads 104, and first portion 132' of the metal dam 110. A seed layer 130 may not be included in these embodiments, for example.

Figure 9:
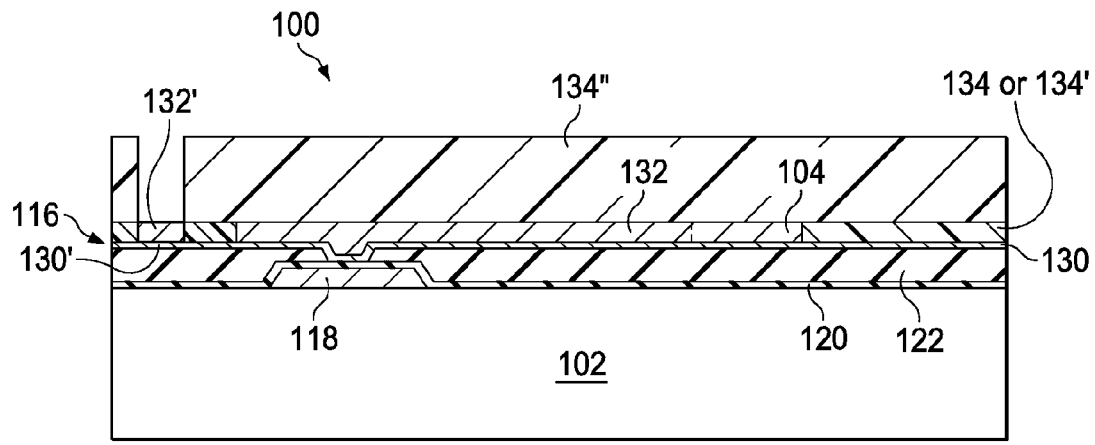

Second portions 136 of the metal dam 110 (see FIG. 10) are then formed over the first portion 132' and seed layer 130' of the metal dam 110. To form the second portions 136, a layer of photoresist 134" is formed over the photoresist 134 or insulating material 134', the PPI lines 132, the contact pads 104, and first portion 132' of the metal dam 110, as shown in FIG. 9. The layer of photoresist 134" comprises a dry film photoresist in some embodiments, to achieve a metal dam 110 having a sufficient or greater thickness. Other types of photoresist 134" may also be used. The layer of photoresist 134" is patterned for the desired pattern for a second portion 136 of the metal dam 110 to expose the first portion 132' of the metal dam 110, also shown in FIG. 9. The pattern for the second portion 136 of the metal dam 110 is substantially the same as the pattern for the first portion 132' of the metal dam 110 in some embodiments, for example. Alternatively, the pattern for the second portion 136 of the metal dam 110 may be different than the pattern for the first portion 132' of the metal dam 110, not shown. As examples, the pattern for the second portion 136 of the metal dam 110 may have a greater, smaller, or the same width as the pattern for the first portion 132' of the metal dam 110.

Figure 10:
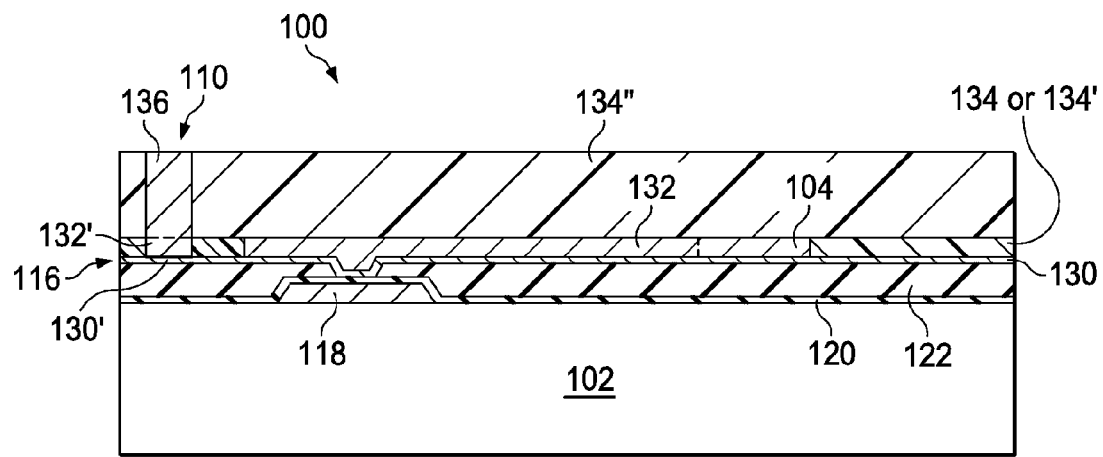
Figure 11:
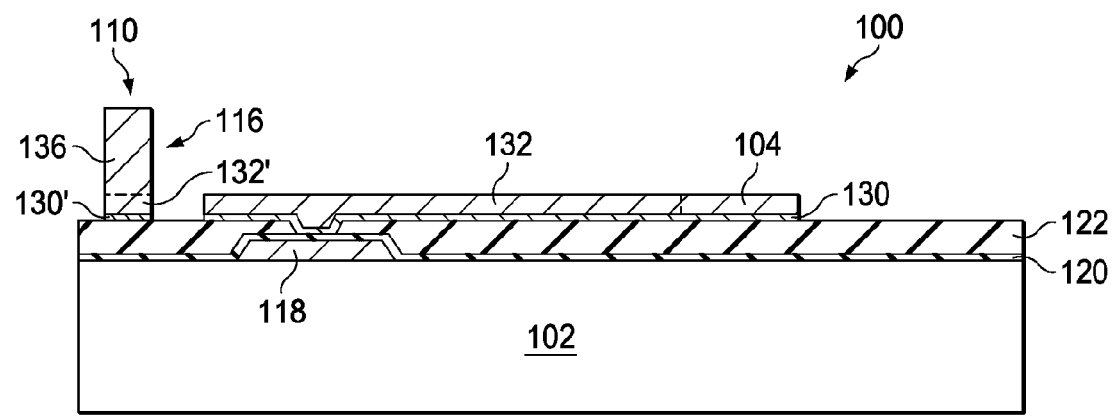

The second portion 136 of the metal dam 110 is then formed over the first portion 132' using a plating process, as shown in FIG. 10. The second portion 136 of the metal dam 110 is plated onto the first portion 132' through the patterned layer of photoresist 134". The metal dam 110 includes the first portion 132' and the second portion 136. In some embodiments, the metal dam 110 also includes the seed layer 130'. The layer of photoresist 134" and the layer of photoresist 134 or insulating material 134' are then removed using a photoresist wet strip or other removal process, as shown in FIG. 11. The seed layer 130 left remaining over the top surface of the insulating material 122 is also removed, e.g., using an etch process or other process.

In other embodiments, the second portion 136 of the metal dam 110 may be formed using a subtractive etch process, as another example, by depositing a conductive material, and patterning the conductive material using photolithography techniques to form the second portion of the metal dam 110.

In the embodiments shown in FIGS. 8 through 11, the RDL 116 is formed in a single conductive material layer comprising the PPI lines 132 and the contact pads 104 comprising the PPI pads 104. In other embodiments, additional conductive material layers may be included in the RDL 116, and the contact pads 104 are formed in an uppermost conductive material layer of the RDL 116 so that conductive material 106 can be coupled to the contact pads 104 (see FIG. 13). The metal dam 110 is formed in one or more conductive material layers of the RDL 116 in some embodiments, for example. The metal dam 110 is formed in the same conductive material layer that the contact pads 104 are formed from in some embodiments, as another example.

Figure 12:
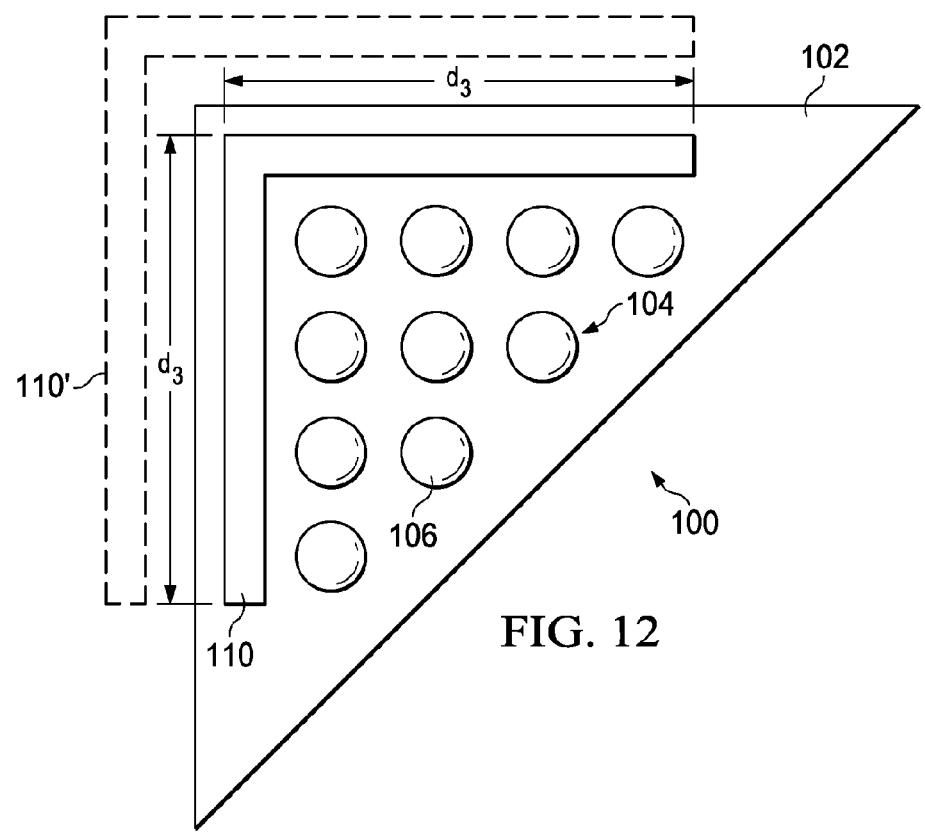
FIG. 12 is a bottom view showing a corner region of a semiconductor device that includes a metal dam in accordance with some embodiments.

FIG. 12 is a bottom view of a corner region of a semiconductor device 100 that includes a metal dam 110 in accordance with some embodiments. The metal dam 110 is disposed proximate at least four contact pads 104 on a side of the BGA in each of the plurality of corners, in some embodiments. The metal dam 110 comprises an "L" shape, with each side of the L extending along at least four contact pads 104, for example. In some embodiments, the metal dam 110 extends along at least three contact pads 104 on both sides of each corner region of the BGA of contact pads 104, as another example.

In some embodiments, more than one metal dam is placed proximate the corner regions of the BGA, as shown in phantom (e.g., in dashed lines) in FIG. 12 at 110'. For example, in some embodiments, the metal dam 110 comprises a first metal dam 110, and the semiconductor device further comprises a second metal dam 110' proximate the first metal dam 110. Three or more metal dams 110 or 110' may alternatively be included on the semiconductor device 100 proximate the corners of the BGA in other embodiments, not shown.

FIG. 13 is a cross-sectional view of semiconductor devices 100 in accordance with some embodiments, illustrating some dimensions of the various elements. FIG. 13 shows a more detailed view of FIG. 3 proximate the scribe line 114. The metal dam 110 comprises a thickness comprising dimension $d_4$ which comprises about 50 μm to about 130 μm in some embodiments. The conductive material 106 comprises a height or diameter comprising dimension $d_5$ which comprises about 270 μm or less in some embodiments. The protective material 108 comprises a thickness comprising dimension $d_6$ which comprises about 50 μm to about 130 μm in some embodiments. Alternatively, dimensions $d_4$, $d_5$, and $d_6$ may comprise other values.

The protective material 108 advantageously comprises a substantially uniform layer of the protective material 108 comprising dimension $d_6$ across substantially the entire surface of the substrate 102, due to the inclusion of the novel metal dam 110 in the semiconductor device 100 structure in some embodiments. The metal dam 110 ensures that the protective material 108 has a sufficient height in the corner regions of the BGA and also prevents the protective material 108 from flowing over and past the metal dam 110.

In some embodiments, the conductive material 106 comprises a conductive bump comprising a first height comprising dimension $d_5$, and the metal dam 110 comprises a second height comprising dimension $d_4$, wherein the second height comprising dimension $d_4$ is about ⅓ of the first height comprising dimension $d_5$ or greater. Alternatively, dimensions $d_4$ and $d_5$ may comprise other relative values.

FIGS. 14 and 15 are bottom views illustrating various shapes of metal dams 110 of semiconductor devices 100 in accordance with some embodiments. In FIG. 14, a metal dam 110 comprising a substantially polygon shape is shown, and in FIG. 15, a metal dam 110 comprising a substantially circular shape is shown, as examples. The metal dams 110 are not continuous and include gaps in central regions of the sides of the BGA of the semiconductor device 100. Alternatively, the metal dam 110 may comprise other shapes.

Figure 16:
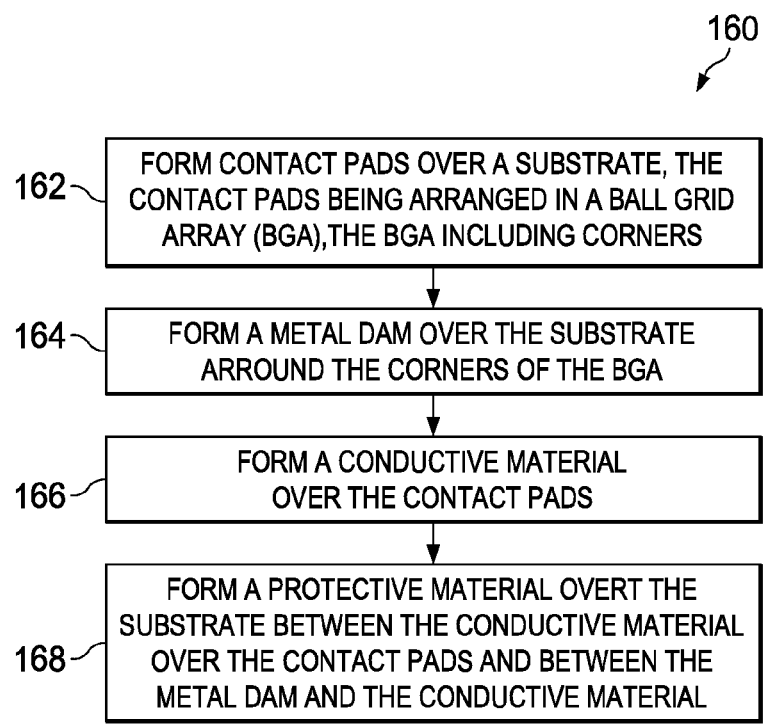
FIG. 16 is a flow chart illustrating a method of manufacturing a semiconductor device in accordance with some embodiments.

FIG. 16 is a flow chart 160 illustrating a method of manufacturing a semiconductor device 100 in accordance with some embodiments. In step 162, contact pads 104 are formed over a substrate 100 (see also FIG. 4), the contact pads 104 being arranged in a BGA that includes corners. In step 164, a metal dam 110 is formed over the substrate 102 around the corners of the BGA (see FIG. 5). In step 166, a conductive material 106 is formed over the contact pads 104

(see FIG. 6). In step 168, a protective material 108 is formed over the substrate 102 between the conductive material 106 over the contact pads 104 and between the metal dam 110 and the conductive material 106 (see FIG. 7).

Some embodiments of the present disclosure include methods of manufacturing semiconductor devices that include the novel metal dams described herein, and also include semiconductor devices that include the metal dams. Some embodiments of the present disclosure also include packaged semiconductor devices that have been packaged using packages that include the metal dams described herein.

Advantages of some embodiments of the disclosure include providing novel metal dams and methods of formation thereof that provide semiconductor devices with improved reliability. Novel BGA structures are disclosed that include the metal dams proximate corner regions of the BGA. A thin protective material or lack of protective material at corners of the BGA is avoided, due to the inclusion of the metal dams in the semiconductor devices. Portions of the metal dams are formed during the formation of wiring of the semiconductor devices, such as contact pads 104, in some embodiments.

The metal dams may advantageously be formed using commonly used lithography and/or plating processes. Only one additional lithography mask and one additional lithography process are required to include the novel dams in semiconductor device designs. In some embodiments, the metal dams are formed using two plating processes; a first plating process to form a first portion of the metal dams that is also used to form contact pads, and a second plating process to form a second portion of the metal dams.

Corner contact pads of the BGA are protected well by the uniformly applied protective material, preventing or reducing reliability problems. The protective material is substantially uniform over the entire surface of the semiconductor device. The protective material has substantially the same thickness at corner regions, center regions, and edge regions. Furthermore, the novel metal dam structures and designs are easily implementable in manufacturing process flows.

The metal dams are particularly beneficial when implemented in surface mount technology (SMT) devices such as SMT integrated circuit dies and SMT packages, as examples. The SMT devices include the spin-on protective material rather than requiring the use of an underfill material, providing a cost savings. The metal dams block the protective material during the coating process, ensuring that the height of the protective material is uniform at the semiconductor device center and edges and also ensuring that critical corner conductive bumps are well protected by the protective material.

In accordance with some embodiments of the present disclosure, a semiconductor device includes a substrate and a plurality of contact pads disposed over the substrate. The contact pads are arranged in a BGA, and the BGA includes a plurality of corners. A metal dam is disposed around each of the plurality of corners of the BGA.

In accordance with other embodiments, a semiconductor device includes a substrate and a plurality of contact pads disposed over the substrate. The contact pads are arranged in a BGA, and the BGA includes a plurality of corners. A conductive material is disposed over each of the plurality of contact pads. A metal dam is disposed around each of the plurality of corners of the BGA.

In accordance with other embodiments, a method of manufacturing a semiconductor device includes forming a plurality of contact pads over a substrate. The plurality of contact pads are arranged in a BGA, and the BGA includes a plurality of corners. The method includes forming a metal dam over the substrate around each of the plurality of corners of the BGA, and forming a conductive material over each of the plurality of contact pads. A protective material is formed over the substrate between the conductive material over each of the plurality of contact pads and between the metal dam and the conductive material.

In another embodiment, a method of manufacturing a semiconductor device is provided. The method includes forming a plurality of contact pads over a substrate, the plurality of contact pads being arranged in a ball grid array (BGA), the BGA including a plurality of corners, and forming a metal dam over the substrate around each of the plurality of corners of the BGA. A conductive material is formed over each of the plurality of contact pads, and a protective material is formed over the substrate between the conductive material over each of the plurality of contact pads and between the metal dam and the conductive material.

In yet another embodiment, a method of manufacturing a semiconductor device is provided. The method includes forming a plurality of contact pads on a substrate, forming a dam over the substrate around a periphery of the plurality of contact pads, the dam comprising a plurality of segments disconnected from each other, and forming external connectors, each of the external connectors being over a corresponding one of the plurality of contact pads. After forming the dam and the external connectors, a protective material is formed over the substrate between the external connector and the plurality of segments of the dam.

In yet still another embodiment, a method of manufacturing a semiconductor device is provided. The method includes forming a first integrated circuit and a second integrated circuit on a wafer, the first integrated circuit and the second integrated circuit being separated by a scribe line, the first integrated circuit and the second integrated circuit having contact pads formed thereon. The method further includes forming one or more first dams on the first integrated circuit, the one or more first dams extending along the scribe line, and forming one or more second dams on the second integrated circuit, the one or more second dams extending along the scribe line. External connectors are formed on the contact pads of the first integrated circuit and the second integrated circuit, and a protective material is formed on the first integrated circuit and the second integrated circuit, the protective material being disposed between the one or more first dams and the external connectors on the first integrated circuit and between the one or more second dams and the external connectors on the second integrated circuit, wherein the external connectors extend farther from the wafer than the one or more first dams and the one or more second dams.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, the method comprising:
forming a first integrated circuit and a second integrated circuit on a wafer, the first integrated circuit and the second integrated circuit being separated by a scribe line;
forming a post-passivation interconnect (PPI) layer over each of the first integrated circuit and the second integrated circuit, the PPI layer comprising a plurality of PPI pads over each of the first integrated circuit and the second integrated circuit, the PPI layer comprising a first dam layer over the first integrated circuit and a first dam layer over the second integrated circuit separated from each other by the scribe line; forming a second dam layer on the first dam layer over the first integrated circuit and a second dam layer on the first dam layer over the second integrated circuit;
forming external connectors on at least some of the plurality of PPI pads over the first integrated circuit and the second integrated circuit; and
after forming the external connectors, forming a protective material on the first integrated circuit and the second integrated circuit, the protective material being disposed adjacent the second dam layer over the first integrated circuit and adjacent the second dam layer over the second integrated circuit, the scribe line between the second dam layer over the first integrated circuit and the second dam layer over the second integrated circuit being free of the protective material, wherein the external connectors extend further from the wafer than the second dam layer over the first integrated circuit and the second dam layer over the second integrated circuit.

2. The method of claim 1, wherein forming the second dam layer comprises:
forming a mask over the PPI layer, the mask having openings over the first dam layer over the first integrated circuit and over the first dam layer over the second integrated circuit; and
forming the second dam layer in the openings.

3. The method of claim 2, wherein the mask is a photoresist layer.

4. The method of claim 1, wherein the second dam layer is spaced apart from a nearest contact pad by 100 μm or greater.

5. The method of claim 1, wherein the second dam layer over the first integrated circuit extends along adjacent sides of first integrated circuit.

6. The method of claim 5, wherein the second dam layer forms a corner over the first integrated circuit, wherein surfaces of the second dam layer at the corner is absent the protective material.

7. The method of claim 1, wherein forming the external connectors comprises placing solder material on the at least some of the plurality of PPI pads over the first integrated circuit and the second integrated circuit, the external connectors being exposed through the protective material.

8. The method of claim 1, wherein after forming the protective material, singulating the first integrated circuit from the second integrated circuit, wherein the protective material is not removed during the singulating.

9. A method of manufacturing a semiconductor device, the method comprising:
forming a first conductive layer over a substrate, the first conductive layer comprising a plurality of conductive lines and a first portion of a plurality of dams;
forming a second portion of the plurality of dams over the first portion of the plurality of dams, the second portion extending further from the substrate than the first conductive layer;
forming a conductive material over respective ones of the plurality of conductive lines; and
forming a protective material over the substrate between the second portion and the conductive material.

10. The method of claim 9, wherein forming the first conductive layer comprises:
forming a first mask over the substrate, the first mask having first openings; and
forming the first conductive layer in the first openings.

11. The method of claim 10, wherein forming the second portion comprises:
forming a second mask over the first mask and the first conductive layer, the second mask having second openings; and
forming the second portion in the second openings.

12. The method of claim 11, further comprising, after forming the second portion in the second openings:
removing the second mask; and
removing the first mask.

13. The method of claim 12, wherein forming the first mask comprises forming a first photoresist layer and patterning the first photoresist layer, and wherein forming the second mask comprises forming a second photoresist layer and patterning the second photoresist layer.

14. The method of claim 9, wherein at least a portion of an interior surface of the second portion is free of the protective material.

15. The method of claim 9, wherein the second portion has a width of about 25 μm.

16. A method of manufacturing a semiconductor device, the method comprising:
simultaneously forming contact regions and a first layer of a plurality of dams over a substrate, the substrate comprising an integrated circuit;
forming a second layer of the plurality of dams over the first layer of the plurality of dams, a first dam of the plurality of dams extending along adjacent sidewalls of a corner of the integrated circuit in a plan view;
forming external connectors, each of the external connectors being over a corresponding one of the contact regions; and
after forming the second layer and the external connectors, forming a protective material over the substrate adjacent the external connectors.

17. The method of claim 16, wherein forming the contact regions comprises:
forming a seed layer;
forming a first mask over the seed layer;
forming first openings in the first mask, the seed layer being exposed in the first openings; and
forming the contact regions and the first layer using a electroplating process.

18. The method of claim 17, wherein forming the second layer comprises:
   forming a second mask over the first mask; and
   forming second openings in the second mask, the second openings exposing the first layer.

19. The method of claim 18, further comprising:
   removing the first mask and the second mask; and
   removing exposed portions of the seed layer.

20. The method of claim 16, wherein the second layer is arranged adjacent each corner of the substrate.

* * * * *